United States Patent [19]
Williamson

[11] Patent Number: 6,111,476
[45] Date of Patent: Aug. 29, 2000

[54] NON-CONTACT COUPLING SYSTEM

[75] Inventor: John Michael Williamson, Stittsville, Canada

[73] Assignee: Nortel Networks Corporation, Montreal, Canada

[21] Appl. No.: 09/217,058

[22] Filed: Dec. 21, 1998

[51] Int. Cl.[7] .................................. H01P 5/18; H03H 7/48
[52] U.S. Cl. ............................................ 333/109; 333/116
[58] Field of Search ..................................... 333/109, 110, 333/115, 116

[56] References Cited

U.S. PATENT DOCUMENTS

| | | | |
|---|---|---|---|
| 3,573,674 | 4/1971 | Wehner | 333/110 X |
| 3,619,504 | 11/1971 | De Veer et al. | 333/109 X |
| 4,999,593 | 3/1991 | Anderson | 333/116 X |
| 5,365,205 | 11/1994 | Wong | 333/109 |
| 5,376,904 | 12/1994 | Wong | 333/109 |
| 5,432,486 | 7/1995 | Wong | 333/109 |

OTHER PUBLICATIONS

Hideki Osaka et al; "1GT/s Back Plane Bus (XTL:Crosstalk Transfer Logic) using Crosstalk Mechanism"; pp. 1–7.

*Primary Examiner*—Paul Gensler

[57] ABSTRACT

The invention is a non-contact coupling system for use in interconnecting a large number of electronic modules to a main signal trace via non-contact couplers. A driver sends an electronic signal comprising pulses along the main signal trace. The couplers each have a track of conductive material substantially parallel to the main signal trace. The track of each succeeding coupler is longer than that of the preceding coupler. As a pulse travels from the driver alongside the track of the closest coupler, a pulse is induced therein, although part of the original pulse energy is lost. The remaining lower-energy pulse then couples onto the second-closest coupler but because of the longer parallel track, an induced pulse virtually as strong as the pulse imparted to the first coupler is produced. This phenomenon occurs at every coupler along the main signal trace, resulting in induced pulses that have a relatively low amplitude variation.

18 Claims, 1 Drawing Sheet

NON-CONTACT COUPLING SYSTEM

FIELD OF THE INVENTION

The present invention relates to non-contact coupling systems and, more particularly, to systems having a main signal trace and a plurality of couplers with respective lengths of track positioned substantially parallel to the main signal trace.

BACKGROUND OF THE INVENTION

Modern large-scale telecommunications electronics systems or mainframe computing systems typically comprise shelves of modules for processing, data exchange or memory storage. These modules are interconnected by means of a large printed circuit board (PCB), known as a backplane, placed in the back of a cabinet in which the shelves reside. In a traditional architecture, the individual modules are plugged into the backplane via hardware point-to-multipoint interconnects.

The quest for greater interconnect throughput has resulted in the need for the backplane to carry lines running at upwards of 1 gigabit per second (Gbps). However, at such rates, the use of conventional hardwired interconnects is not feasible due to the fact that they cannot be terminated in the line characteristic impedance. Furthermore, reliability requirements favour isolation among modules so that catastrophic failure of one module does not affect the others.

These ever more demanding requirements of speed and reliability have spawned the development of what are known in the data transmission field as non-contact (or "AC") buses and backplanes, a discussion of which can be found in U.S. Pat. No. 3,619,504 (De Veer et al.), incorporated by reference herein. In a system employing non-contact technology, a main signal trace carries a data signal and a number of substantially identical couplers are placed in a row along the main signal trace.

More specifically, each of the substantially identical couplers has a conductive track of a given length placed in parallel to the main signal trace. As electrical pulses from a signal driver travel along the main signal trace, electric and magnetic fields are induced in the track of each coupler, causing the generation of a backwards pulse in each coupler that is picked up by a respective receiver.

In an ideal non-contact system, the signals being induced in each coupler should have the same strength. However, a fraction of the energy of a data pulse is lost as it couples into each subsequent coupler. Furthermore, at frequencies exceeding 1 GHz loss due to the transmission line itself can be significant. Therefore, the last coupler receives a significantly weaker signal than the first coupler, resulting in a large disparity in the voltages that are received by the receivers connected to the various couplers. The receivers used in current non-contact coupling systems must therefore support a wide dynamic range, inconveniently leading to a high overall system cost.

SUMMARY OF THE INVENTION

It is an object of the present invention to mitigate or obviate one or more disadvantages of the prior art.

Therefore, the invention may be summarized according to a first broad aspect as a non-contact coupling system comprising a main signal trace, a signal driver connected to the main signal trace and a plurality of non-contact couplers positioned longitudinally along the main signal trace, each coupler having a respective length of track substantially parallel to the main signal trace. Advantageously, the track of each succeeding coupler is longer than that of the preceding coupler.

In accordance with a second broad aspect, the invention may be summarized as a non-contact coupling system, comprising elongate conducting means; a plurality of longitudinally positioning non-contact coupling means each having a conductive portion substantially parallel to said conducting means; and transmitting means connected to a first end of the conducting means, for transmitting an electronic signal along said conducting means and inducing a corresponding electronic signal in each of the coupling means; wherein, for each pair of coupling means, the conductive portion of the coupling means located further from the transmitting means is longer than that of the coupling means located closer to the transmitting means.

The invention may be summarized according to a third broad aspect as a method of selecting values for the track lengths, comprising the steps of determining a critical track length for an intermediate one of the plurality of couplers, wherein the pulses induced in the intermediate coupler have an amplitude that depends on the track length of the intermediate coupler for a track length less than the critical track length and wherein the induced pulses have an amplitude that does not depend on the track length of the intermediate coupler for a track length greater than the critical track length; determining the spread among the amplitudes of pulses that would be induced in each of the plurality of couplers if each track length was identical to the critical track length of the intermediate coupler; setting the track length of the coupler farthest the signal driver equal to the critical track length of the intermediate coupler multiplied by a factor that is proportional to the calculated spread; setting the track length of the coupler nearest the signal driver equal to the critical track length of the intermediate coupler divided by a factor that is proportional to the calculated spread; and setting the track length of each remaining coupler to a value greater than the track length of the coupler nearest the signal driver, less than the track length of the coupler farthest the signal driver and representative of the relative position of the coupler.

The invention can be summarized according to a fourth broad aspect as a method of selecting values for the track lengths, comprising the steps of selecting an initial track length for each coupler; determining the spread among the amplitudes of the pulses induced in each of the couplers; and varying the track length of one or more couplers and repeating the step of determining the spread until a sufficiently low value for the spread is obtained.

BRIEF DESCRIPTION OF THE DRAWINGS

The preferred embodiment of the present invention will now be described with reference to FIG. 1, in which is shown a schematic diagram of a non-contact coupling system in accordance with the present invention and which qualitatively illustrates the shape of a pulse as it travels along the main signal trace.

DETAILED DESCRIPTION OF THE PREFERRED EMBODIMENT

Figure 1:
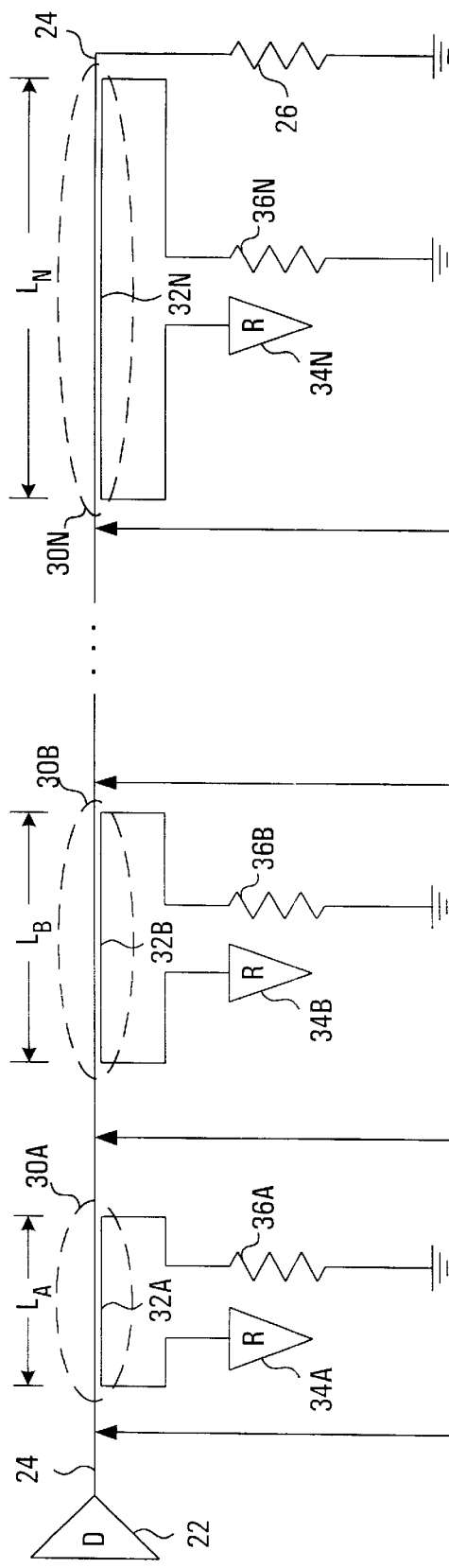
Figure 1:
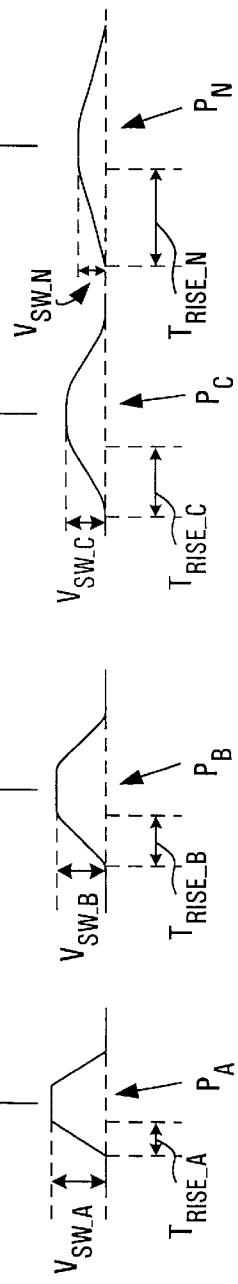

With reference to FIG. 1, there is schematically illustrated a point-to-multipoint transmission system comprising a main signal trace 24, a driver 22 connected to one end of the main signal trace 24 and a plurality of couplers 30A . . . 30N longitudinally spaced along the main signal trace 24 and coupled thereto in non-contact fashion. It should be appreciated that the invention applies both to common-mode non-contact couplers (as illustrated in FIG. 1) and to differential mode non-contact couplers.

In a preferred physical configuration, the driver 22 may occupy a slot connected to a backplane located within a digital equipment chassis, while the non-contact couplers 30A . . . 30N may occupy respective slots which are coupled to the main signal trace 24 via a dielectric. Thus, the maximum number of couplers may in some instances be limited by the number of available slots in a backplane minus one for the driver. However, it is to be understood that in general, the present invention is applicable to any number N of non-contact couplers.

Typically, the main signal trace 24 occupies a conductive path traced out in a printed circuit board (PCB), which is separated from ground via a dielectric material that causes it to behave as a transmission line with characteristic impedance $Z_0$ and relative dielectric constant $\epsilon$. In order to avoid reflections at the far end of the main signal trace 24, the latter is terminated by a terminating element 26, preferably a resistor whose resistance is equal to $Z_0$.

Non-contact couplers 30A . . . 30N are each made up of a respective segment of the main signal trace 24 and a respective portion of conductive track 32A . . . 32N which runs parallel to the main signal trace 24 along a respective length $L_A$ . . . $L_N$. At the edges of each respective coupler 30A . . . 30N, conductive tracks 32A . . . 32N are bent away from the main signal trace and connected to a respective receiver 34A . . . 34N at one end and to a respective terminating element 36A . . . 36N at another end, which connections may be made through a maze of connector vias.

Conductive tracks 32A . . . 32N are each separated from ground by a dielectric that causes them to behave as transmission lines with their own characteristic impedances. Those skilled in the art will appreciate that these characteristic impedances are easily controllable and that it is advantageous to make them equal to the characteristic impedance $Z_0$ of the main signal trace 24. Preferably, therefore, terminating elements 36A . . . 36N are resistors having a resistance $Z_0$.

It is a crucial feature of the present invention to make the length of each succeeding non-contact coupler greater than that of the preceding one, i.e., so that $L_A<L_B$, $L_B<L_C$, and so on. Thus, although a pulse emitted by the driver 22 is weakened by each succeeding coupler absorbing a portion of its energy, the progressively weaker pulse will travel alongside tracks of progressively greater length, resulting in equalization of the pulses induced in the couplers. As the number of couplers increases, so does the need for equalization of the induced pulses by choosing advantageous values for $L_A$ . . . $L_N$. A preferred method of calculating such values for $L_A$ . . . $L_N$ is disclosed hereinbelow.

In operation, the driver 22 emits trapezoidal pulses having relatively sharp edges (a short rise and fall time) and a somewhat longer but still relatively short duration, e.g., on the order of 0.1 to 1 nanosecond. One example of such a pulse is pulse $P_A$ shown in FIG. 1, having a rise time $T_{RISE\_A}$ and a voltage swing $V_{SW\_A}$. The pulse $P_A$ is coupled both inductively and capacitively onto the track 32A of coupler 30A. If the dielectric which separates the main signal trace 24 and the tracks 32A . . . 32N from ground is homogeneous, as is preferably the case, then pulses induced in the couplers 30A . . . 30N will travel in a reverse direction and will be received by receivers 34A . . . 34N.

The size and shape of the backward pulse induced in coupler 30A and as received by receiver 34A is dependent on the track length $L_A$ and the characteristics of the pulse $P_A$, i.e., its voltage swing $V_{SW\_A}$, rise time $T_{RISE\_A}$ and propagation delay $D_P$. In general, it has been found that higher induced voltages arise from a shorter rise time for the original pulse and, more specifically, that the induced crosstalk voltage $V_{XTLK\_i}$ due to the ith pulse $P_i$ having a peak-to-peak voltage swing of $V_{SW\_i}$ volts obeys the following relationship:

$$V_{XTLK\_i} = 4 \cdot K \cdot D_P \cdot V_{SW\_i} \frac{L_i}{T_{RISE\_i}}, \quad L_i < L_{CRIT\_i} \quad (1)$$

$$V_{XTLK\_i} = 2 \cdot K \cdot V_{SW\_i}, \quad L_i \geq L_{CRIT\_i}$$

where K is a known constant coupling factor (between 0 and 1).

From the above equation, it is seen that when the track length $L_A$ is above a critical value $L_{CRIT\_A}$, the induced voltage $V_{XTLK\_A}$ is no longer dependent on the track length. This critical value $L_{CRIT\_A}$, also known as the saturation length for track 32A, can be found by determining the common solution to both of the above equations and is given by $$L_{CRIT\_A} = \frac{T_{RISE\_A}}{2 \cdot D_P}.$$

The propagation time $D_P$ is the reciprocal of the speed of light in the transmission line formed by the main signal trace 24 and is given by $$D_P = \frac{10}{3} \sqrt{\epsilon} \times 10^{-9}$$

seconds/meter, where $\epsilon$ is the aforementioned relative dielectric constant of the transmission line. Thus it can be shown that $L_{CRIT\_A}$ obeys the simple relationship:

$$L_{CRIT\_A} = \frac{3 \cdot T_{RISE\_A}}{20\sqrt{\epsilon} \times 10^{-9}}. \quad (2)$$

The saturation length $L_{CRIT\_i}$ for the ith coupler 30$i$ is given by substituting the appropriate rise time $T_{RISE\_i}$ in equation (2).

As the original pulse $P_A$ imparts a backwards pulse to the first coupler 30A, it loses a certain amount of energy, resulting in a longer rise time in the leftover pulse. By way of example, pulse $P_B$ in FIG. 1 qualitatively exhibits this longer rise time $T_{RISE\_B}$ resulting from pulse $P_A$ having passed on a fractional amount of energy to coupler 30A. Similarly, pulse $P_C$ shows the characteristics of pulse $P_B$ after coupling onto coupler 30B and pulse $P_N$ is illustrative of the shape of the pulse about to be coupled to coupler 30N.

From FIG. 1, it can be seen that the pulse remaining on the main signal trace 24 has a progressively longer rise time as more couplers are passed. Also, losses in the transmission line formed by the main signal trace 24 being separated from ground result in a progressively lower voltage swing for each succeeding coupler.

According to equation (1) above, it would appear that the lengthening of the rise time and lowering of the voltage swing of the main pulse as each coupler is passed would result in a progressively lower crosstalk voltage being induced in each succeeding coupler. However, by increasing the length $L_i$ of each succeeding track 32$i$ (provided, of course, that $L_i$ remains less than or equal to $L_{CRIT\_i}$), equation (1) demonstrates that the voltage $V_{XTLK\_i}$ of the induced backwards pulse in each coupler can be kept within a substantially narrow dynamic range, advantageously resulting in equalization of the coupled signals and allowing the use of less expensive receivers 34A . . . 34N.

Furthermore, because the track lengths $L_A$ . . . $L_N$ are monotonically increasing, construction of the non-contact system is facilitated. In addition, since the near-end couplers are smaller, there is less overall line loss and there is more room to place the couplers on the backplane.

The preferred method of determining suitable values for the track lengths $L_A$ . . . $L_N$ is now described. Calculation of $L_A$ . . . $L_N$ can be done off line by using a standard calculator or microprocessor along with a simulation tool, test bed or analytical methods. The method begins by considering the N/2th coupler and an initial pulse $P_A$. (If N is odd, then the middle coupler is chosen as the N/2th coupler.) For simplicity, the pulse $P_{N/2}$ (not shown) passing alongside this N/2th coupler is assumed to have the same rise time $T_{RISE\_A}$ as the initial pulse $P_A$. Next, insertion of the rise time $T_{RISE\_A}$ into equation (2) above yields a value for the critical track length $L_{CRIT\_N/2}$ for the N/2th coupler.

The N/2th track length $L_{N/2}$ is set to the critical track length $L_{CRIT\_N/2}$ just determined and the remaining track lengths are then found. To this end, all track lengths are temporarily set equal to $L_{CRIT\_N/2}$ and the ratio of the induced voltage $V_{XTLK\_A}$ to the induced voltage $V_{XTLK\_N}$ is determined using analytic methods, a simulation tool or actual measurements; this ratio can be represented as the square of a positive value M.

Next, for the first coupler 30A, the track length $L_A$ may be found by dividing $L_{N/2}$ by M and for the last coupler 30N, the track length $L_N$ may be found my multiplying $L_{N/2}$ by M; thus the shortest and longest tracks are related by the factor $M^2$. The intermediate track lengths are then found by interpolation (e.g., linear, parabolic or exponential) between $L_{N/2}$ and the appropriate extreme. It has been found that a track length calculated by this method generally does not exceed the critical track length for the associated coupler.

The design of an example non-contact coupling system in accordance with the just described method is now considered. It is assumed that a non-contact bus similar to the one in FIG. 1 calls for a driver, fifteen couplers with respective receivers and two centimeters of main signal trace between each coupler. Thus, the N/2th coupler is actually the 8th coupler.

Next, given a rise time of 144 picoseconds (ps) for the pulse emitted by the driver and given that the relative dielectric constant $\epsilon$ is equal to 3.9, equation (2) is used to find that $L_{CRIT\_8}$=10.9 millimeters (mm). Using a simulation tool, it was found that the first coupler voltage $V_{XTLK\_A}$ was equal to about 200 millivolts (mV) and that the last coupler voltage $V_{XTLK\_N}$ was about equal to 80 mV. Therefore, $M^2$=2.5 and M=1.581 (approximately). Hence, the first (near-end) coupler should be 6.9 mm long, the eighth coupler should have a length of 10.9 mm and the fifteenth (far-end) coupler should be 17.2 mm long.

After applying this scaling, parabolic interpolation was used to find the remaining track lengths and the simulation was re-run. The induced voltage $V_{XTLK\_A}$ was found to be 154 mV while the induced voltage $V_{XTLK\_N}$ was found to be 118 mV, giving a total span of 36 mV. This is a 70% reduction in the induced voltage span as compared with the case when all couplers are of length equal to 10.9 millimeters.

Of course, it is to be appreciated that any track could be used as a reference, not necessarily that associated with the N/2th (or middle) coupler. This would be desirable for biasing the lengths towards that of a closer or farther coupler. Furthermore, the ratio of $V_{XTLK\_A}$ to $V_{XTLK\_N}$ when all lengths are equal need not be set to the square of M, but may be set equal to some other function thereof which is monotonic for positive values of M. Also, other interpolation schemes may be adopted to determine the track length between other pairs of couplers. In either case, the resultant voltage spread among the $V_{XTLK\_i}$ can be significantly reduced relative to that of a system in which the track lengths are equal, permitting the use of inexpensive receivers 34A . . . 34N having a low dynamic range, facilitating construction of the non-contact system and reducing overall line loss.

Finally, it is possible to calculate track lengths $L_A$ . . . $L_N$ for which the voltage spread among the voltages $V_{XTLK\_A}$ . . . $V_{XTLK\_N}$ falls within a precisely controlled an even narrower range. This is achievable by the following steps:

STEP A: An initial set of track lengths $L_A$ . . . $L_N$ for the various couplers is selected.

STEP B: The ith coupler is selected, starting with coupler 30A.

STEP C: The rise times $T_{RISE\_A}$ . . . $T_{RISE\_N}$ and voltage swings $V_{SW\_A}$ . . . $V_{SW\_N}$ of a data pulse prior to coupling at each coupler 30A . . . 30N are obtained using a simulation tool or by analytical methods.

STEP D: The induced voltages $V_{XTLK\_A}$ . . . $V_{XTLK\_N}$ are computed from equation (1) using the values obtained in STEP C.

STEP E: The spread among the induced voltages $V_{XTLK\_A}$ . . . $V_{XTLK\_N}$ is calculated. If a minimum is reached, then a new coupler is selected and STEPS B,C,D and E are repeated; otherwise, the track length $L_i$ is adaptively incremented or decremented, and STEPS C,D are repeated.

Use of the above method does not rely on the calculation of a critical track length but nevertheless leads towards a global minimum for the spread among the induced voltages $V_{XTLK\_A}$ . . . $V_{XTLK\_N}$.

While the preferred embodiment of the present invention has been described and illustrated, it will be apparent to one skilled in the art that numerous modifications and variations are possible. The scope of the invention, therefore, is only to be limited by the claims appended hereto.

I claim:

1. A non-contact coupling system, comprising:
   a main signal trace;
   a plurality of non-contact couplers positioned longitudinally along the main signal trace, each coupler having a respective length of track substantially parallel to the main signal trace; and
   a signal driver connected to the main signal trace, for transmitting an electronic signal along the main signal trace and inducing a corresponding electronic signal in each coupler;
   the track of each succeeding coupler being longer that that of the preceding coupler to provide substantial equalization of the electronic signal induced in each coupler.

2. A non-contact coupling system as according to claim 1, wherein the track length of the coupler furthest from the driver is greater than the track length of the coupler closest to the driver by a factor equal to a function of the ratio between the magnitude of the electronic signal that would be induced in the closest coupler divided by the magnitude of the electronic signal that would be induced in the furthest coupler if all the tracks had an equal length.

3. A non-contact coupling system according to claim 1, wherein the main signal trace is separated from a ground reference by a dielectric exhibiting a relative dielectric constant $\epsilon$, wherein the signal driver produces a signal comprising data pulses having a rise time $T_{RISE}$ and wherein an intermediate one of the plurality of couplers has a length equal to $$\frac{3 \cdot T_{RISE}}{20\sqrt{\epsilon} \times 10^{-9}}.$$

4. A non-contact coupling system according to claim 1, wherein the signal driver transmits data pulses in common mode across the main signal trace.

5. A non-contact coupling system according to claim 1, wherein the signal driver transmits data pulses in differential mode across the main signal trace.

6. A non-contact coupling system according to claim 1, further comprising a terminating element connected to the main signal trace at an end of the main signal trace opposite the signal driver.

7. A non-contact coupling system according to claim 6, wherein the terminating element is a resistor.

8. A non-contact coupling system according to claim 6, wherein the main signal trace exhibits behaviour characteristic of a transmission line having a characteristic impedance and wherein the terminating element has an impedance equal to said characteristic impedance.

9. A non-contact coupling system according to claim 8, wherein the terminating element is a resistor.

10. A non-contact coupling system according to claim 1, wherein each non-contact coupler further comprises a respective receiver connected to an end of the respective track proximate the signal driver.

11. A non-contact coupling system according to claim 10, wherein each non-contact coupler further comprises a respective terminating element connected to an end of the respective track opposite the receiver.

12. A non-contact coupling system according to claim 11, wherein the terminating element is a resistor.

13. A non-contact coupling system according to claim 11, wherein the main signal trace exhibits behaviour characteristic of a transmission line having a characteristic impedance and wherein the terminating element of each non-contact coupler has an impedance equal to said characteristic impedance.

14. A non-contact coupling system according to claim 13, wherein the terminating element is a resistor.

15. A non-contact coupling system, comprising:
    elongate conducting means;
    a plurality of longitudinally positioned non-contact coupling means each having a conductive portion substantially parallel to said conducting means; and
    transmitting means connected to a first end of the conducting means, for transmitting an electronic signal along said conducting means and inducing a corresponding electronic signal in each of the coupling means;
    wherein, for each pair of coupling means, the conductive portion of the coupling means located further from the transmitting means is longer than that of the coupling means located closer to the transmitting means by an amount which reduces the amplitude spread among the induced electronic signals relative to coupling means having conductive portions of equal length.

16. A non-contact coupling system according to claim 15, wherein the conductive portion of the coupling means farthest from the transmitting means is longer than the conductive portion of the coupling means nearest the transmitting means by a factor substantially equal to the ratio between the magnitude of the electronic signal that would be induced in the nearest coupling means divided by the magnitude of the electronic signal that would be induced in the farthest coupling means if the conductive portion of each coupling means were equally long.

17. In a non-contact coupling system comprising a main signal trace, a signal driver connected to the main signal trace and a plurality of non-contact couplers positioned longitudinally along the main signal trace, each coupler having a respective length of track substantially parallel to the main signal trace, the driver capable of inducing pulses in each of the couplers, a method of selecting values for the track lengths, comprising the steps of:

determining a critical track length for an intermediate one of the plurality of couplers, wherein the pulses induced in the intermediate coupler have an amplitude that depends on the track length of the intermediate coupler for a track length less than the critical track length and wherein the induced pulses have an amplitude that does not depend on the track length of the intermediate coupler for a track length greater than the critical track length;

determining the spread among the amplitudes of pulses that would be induced in each of the plurality of couplers if each track length was identical to the critical track length of the intermediate coupler;

setting the track length of the coupler farthest the signal driver equal to the critical track length of the intermediate coupler multiplied by a factor that is proportional to the calculated spread;

setting the track length of the coupler nearest the signal driver equal to the critical track length of the intermediate coupler divided by a factor that is proportional to the calculated spread; and setting the track length of each remaining coupler to a value greater than the track length of the coupler nearest the signal driver, less than the track length of the coupler farthest the signal driver and representative of the relative position of the coupler.

18. In a non-contact coupling system comprising a main signal trace, a signal driver connected to the main signal trace and a plurality of non-contact couplers positioned longitudinally along the main signal trace, each coupler having a respective length of track substantially parallel to the main signal trace, the driver capable of inducing pulses in each of the couplers, a method of selecting values for the track lengths, comprising the steps of:

selecting an initial track length for each coupler;

determining the spread among the amplitudes of the pulses induced in each of the couplers; and varying the track length of one or more couplers and repeating the step of determining the spread until a minimum value for the spread is obtained.

* * * * *